United States Patent [19]

Langner et al.

[11] Patent Number: 4,544,846
[45] Date of Patent: Oct. 1, 1985

[54] VARIABLE AXIS IMMERSION LENS ELECTRON BEAM PROJECTION SYSTEM

[75] Inventors: Günther O. Langner, Westford, Mass.; Hans C. Pfeiffer, Ridgefield, Conn.; Maris A. Sturans, Hopewell Junction, N.Y.

[73] Assignee: International Business Machines Corporation, Armonk, N.Y.

[21] Appl. No.: 508,645

[22] Filed: Jun. 28, 1983

[51] Int. Cl.$^4$ ............................................... H01J 3/20
[52] U.S. Cl. .............................. 250/396 ML; 250/398
[58] Field of Search ........... 250/396 R, 396 ML, 398, 250/311, 492.2, 492.3

[56] References Cited

U.S. PATENT DOCUMENTS

| | | | |
|---|---|---|---|
| 3,717,761 | 2/1973 | Koike et al. | 250/396 ML |
| 3,930,181 | 12/1975 | Pfeiffer | 313/421 |
| 3,984,687 | 10/1976 | Loeffler et al. | 250/396 ML |
| 4,251,728 | 2/1981 | Pfeiffer et al. | 250/396 R |
| 4,310,764 | 1/1982 | Iijima | 250/440 |
| 4,330,709 | 5/1982 | de Chambost | 250/396 ML |
| 4,376,249 | 3/1983 | Pfeiffer et al. | 250/396 ML |

FOREIGN PATENT DOCUMENTS 56-91426  7/1981  Japan ................................. 250/492.3

OTHER PUBLICATIONS

Journal of Vacuum Science & Technology, vol. 19, No. 4 Nov./Dec. 1981, "Advanced Deflection Concept for Large Area, High Resolution E-Beam Lithography", H. C. Pfeiffer & G. O. Langner, pp. 1058-1063.

Primary Examiner—Bruce C. Anderson
Assistant Examiner—Paul A. Guss
Attorney, Agent, or Firm—Douglas A. Lashmit; Mitchell S. Bigel; Edward W. Brown

[57] ABSTRACT

A variable axis immersion lens electron beam projection system shifts the electron beam while eliminating rapidly changing fields, eddy currents and stray magnetic fields in the target area. The electron beam projection system includes an electron beam source and a deflection means. A variable axes immersion lens for focusing the electron beam includes an upper pole piece, and a lower pole piece having a non-zero bore section, a zero bore section and an opening therebetween for inserting the target into the lens. The variable axis immersion lens provides an axial magnetic projection field which has zero first derivative in the vicinity of the target area. A magnetic compensation yoke, positioned within the bore of the upper pole piece produces a magnetic compensation field which is proportional to the first derivative of the axial magnetic projection field. The magnetic compensation field is approximately zero in the target area to thereby eliminate eddy currents in the target holder, target handler and target stepper table. Stray magnetic fields are accordingly eliminated.

17 Claims, 11 Drawing Figures

VARIABLE AXIS IMMERSION LENS ELECTRON BEAM PROJECTION SYSTEM

BACKGROUND OF THE INVENTION

1. Technical Field

This invention relates generally to electron beam projection systems and more particularly to an electron beam projection system which shifts the electron optical axis so as to be coincident with the deflected electron beam while eliminating rapidly varying magnetic fields and eddy currents in the target area.

2. Background Art

Electron beam projection systems are presently enjoying wide use in the semiconductor lithography and mask making fields. An electron beam projection system typically includes an electron beam source, a deflection system for deflecting the electron beam in a predetermined pattern and magnetic projection lenses for focusing the electron beam. The deflected and focused beam is directed to a target which may be, for example, a semiconductor substrate or a mask.

As the circuit density of integrated circuits increases, greater demands are placed on electron beam systems. More particularly, aberrations in the electron beam must be reduced so that accurate control of electron beam shape and position may be obtained.

A major advance toward elimination of electron beam projection system aberrations is described in U.S. Pat. No. 4,376,249 to Pfeiffer et al., which is assigned to the assignee of the present invention. In the Pfeiffer et al. patent, a variable axis electron beam projection system is described wherein the electron optical axis is shifted so as to be coincident with the deflected electron beam at all times. Shifting of the electron optical axis causes the electron beam to always land perpendicular to the target and eliminates lens aberrations caused by off-axis electron beams.

The variable axis electron beam system is a major advance toward eliminating off-axis aberrations in electron beam systems. However, once the major electron beam resolution limiting factors are eliminated, other factors which were previously of little importance now become performance limiting. One such factor is the production of eddy currents caused by the presence of conductive material in the areas of dynamic magnetic fields. The undesired magnetic fields produced by eddy currents and the resultant positional electron beam instabilities present serious problems to the system designer.

In the variable axis electron beam projection system described in the above noted Pfeiffer et al. patent, eddy current production in the electron beam target area has particularly become a problem. This may be seen by examining the configuration of the variable axis electron beam projection system. The system includes an electron beam source and a deflection means. A magnetic projection lens is employed for focusing the deflected beam at a target. The target lies below the lower pole piece of the magnetic projection lens. A first magnetic compensation yoke is positioned within the upper portion of the bore of the projection lens pole piece and a second magnetic compensation yoke is positioned within the lower portion of the bore of the projection lens pole piece. The first and second magnetic compensation yokes produce a magnetic field distribution which is proportional to the first derivative of the axial magnetic field strength distribution of the projection lens. This causes the electron optical axis of the projection lens to shift in conjunction with the deflection of the electron beam.

The above described variable axis electron beam projection system includes a lower compensation yoke positioned within the lower bore of the projection lens, adjacent the target. The rapidly changing field produced by the lower compensation yoke extends into the target area. This rapidly changing magnetic field can produce eddy currents in the target holder, target stepper table and other components containing conductive material, which are employed for supporting, aligning and moving the target. The eddy currents in turn produce stray magnetic fields which produce aberrations in the deflected electron beam.

Of course, eddy currents in the target area could be reduced by moving the target away from the lower pole piece. However, this would increase the aberrations in the overall electron beam system as the distance between the projection lens and the target is increased. Alternatively, eddy currents could be prevented by fabricating all the components in the target area of non-metallic materials. This is difficult, however, because of the rigidity, precision and durability required of the target area components. Accordingly, in order to further improve beam placement accuracy, means are required for eliminating eddy currents in the target area while still producing a compensation field which is proportional to the first derivative of the projection lens field.

SUMMARY OF THE INVENTION

It is an object of the present invention to provide an electron beam projection system having minimal electron beam aberrations.

It is a further object of the invention to produce an electron beam projection system, the electron optical axis of which shifts in conjunction with the deflection of the electron beam.

It is another object of the invention to produce a variable axis electron beam projection system which minimizes eddy current production in the target area.

These and other objects are provided by an electron beam projection system which includes electron beam producing means and deflection means therefor, and a magnetic projection lens means for focusing the predeflected electron beam so that the electron optical axis of the projection lens shifts to be coincident with the predeflected beam. The magnetic projection means comprises an upper pole piece which has a predetermined non-zero bore and a modified lower pole piece including a first section having a non-zero bore and a second section having a zero bore. Means are provided for inserting the target between the upper pole piece and the zero bore section of the lower pole piece so that the projection lens becomes in effect an immersion lens with the target between the pole pieces thereof. A single magnetic compensation yoke means is positioned within the bore of the upper pole piece. The magnetic compensation field produced by the single magnetic compensation yoke is proportional to the first derivative of the axial magnetic field produced by the magnetic projection lens so that the variable axis criterion is satisfied.

The variable axis immersion lens electron beam projection system of the present invention includes a magnetic immersion lens having an upper pole piece with a non-zero bore and a lower pole piece including a section with a zero bore. The magnetic immersion field produced by the immersion lens is at a maximum at the lower pole piece, with the lines of magnetic force entering the zero bore section of the lower pole piece orthogonal thereto. The magnetic field lines are essentially parallel in the vicinity of the lower pole piece; i.e., they have no radial component. Consequently, the first derivative of the axial component of the magnetic field is zero in the vicinity of the lower pole piece zero bore section. Such a lens requires only a single magnetic compensation yoke, at the upper pole piece, for producing a magnetic compensation field which is proportional to the first derivative of the axial magnetic field produced by the projection lens. Thus, a lower compensation yoke and the eddy currents produced by its rapidly changing magnetic fields, are eliminated. Moreover, since the first derivative of the axial lens field is practically zero in the vicinity of the target, the field of the compensation yoke at the upper pole piece is also zero in the vicinity of the target area, by virtue of the variable axis lens field condition. Accordingly, eddy currents in the target area are eliminated.

In a preferred embodiment the zero bore section of the lower pole piece is a solid plate of high permeability, nonconductive ferromagnetic material. Accordingly, the zero bore lower pole piece section also acts as a magnetic shield for shielding the electron beam column from stray magnetic fields originating from outside the electron beam column.

DETAILED DESCRIPTION OF THE INVENTION

Figure 1:
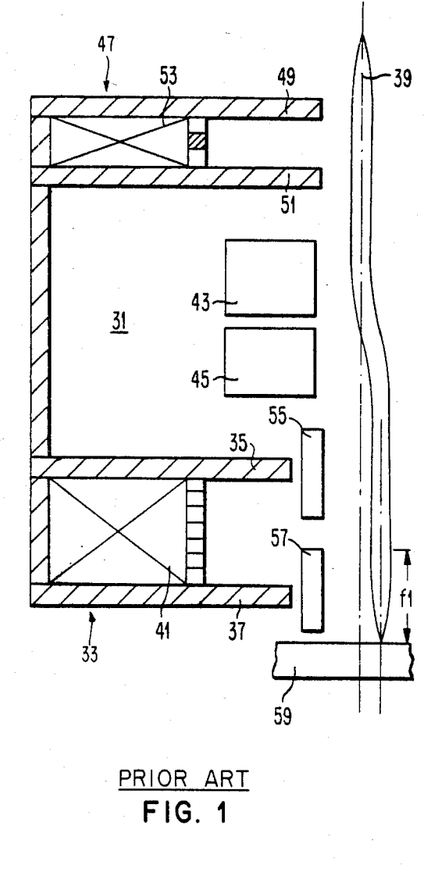
FIG. 1 is a schematic half-sectional drawing illustrating the operation of the variable axis electron beam projection system of the above described Pfeiffer et al. patent.

Referring now to FIG. 1, there is shown a schematic half-sectional drawing illustrating the variable axis electron beam projection system of U.S. Pat. No. 4,376,249 to Pfeiffer et al., the disclosure of which is incorporated herein by reference. The variable axis lens electron beam projection system 31 includes a first magnetic lens 33 having upper and lower pole pieces 35 and 37, respectively. Each pole piece has a circular aperture therein for passage of the electron beam 39 therethrough. In other words, pole pieces 35 and 37 each have a non-zero bore. An excitation coil 41 activates magnetic lens 33. The electron beam 39 is predeflected by deflection yokes 43 and 45. A second magnetic lens 47 having non-zero bore pole pieces 49 and 51 and excitation coil 53 is used to provide telecentricity. The focal length of the second lens is chosen such that the beam leaves this lens as a parallel bundle since the object plane is identical with the focal plane, and the focal length of the first lens is chosen such that this parallel bundle entering this lens is focused on the target plane.

As shown in FIG. 1, the axis of magnetic lens 33 has been shifted to coincide with the shifted center line of the electron beam 39 as it passes through magnetic lens 33. The variable axis lens capability of magnetic lens 33 is provided by first and second magnetic compensation yokes 55 and 57, respectively. First and second magnetic compensation yokes 55 and 57 are designed to produce a magnetic field distribution which is proportional to the first derivative of the field strength distribution of magnetic lens 33 as generated by pole pieces 35 and 37. By satisfying this condition, magnetic compensation yokes 55 and 57 provide a variable axis capability.

Thus, electron beam 39 is deflected by the deflection yoke 43 from the center pathway and is redeflected by deflection yoke 45 so as to enter magnetic lens 33 displaced from but parallel to the original center line. The original center line corresponds to the geometric electron optical axis of magnetic lens 33. By shifting the electron optical axis to the deflected position of the electron beam 39, off-axis aberrations are eliminated. Since the deflected beam 39 enters magnetic lens 33 parallel to the original center line it passes through magnetic lens 33 to the target 59 and lands on target 59 perpendicular thereto. This is a significant advantage of the use of a variable axis lens.

The above described variable axis electron beam projection system provides a major advance toward elimination of electron beam system aberrations. However, once the major electron beam accuracy limiting factors are eliminated, other factors which were previously of little importance now become performance limiting. It will now be shown that eddy currents produced in the target area are a particular problem of the variable axis electron beam projection system.

Referring again to FIG. 1, it will be seen that lower compensation yoke 57 is located immediately adjacent target 59. Lower compensation yoke 57 produces rapidly changing magnetic fields, in order to provide the variable axis capability. However, as is well known by those skilled in the art, an electron beam projection system target area typically includes a target holder for precisely registering the target in the electron beam system, a target handler for inserting and removing the target into and from the electron beam system and a target stepper table for providing target X-Y movement. The rapidly changing magnetic field produced by lower compensation yoke 57 produces eddy currents in ferroconductive target components located adjacent thereto. The eddy currents in turn produce stray magnetic fields which interfere with the projection lens and compensation yoke fields, resulting in electron beam instabilities.

Figure 2:
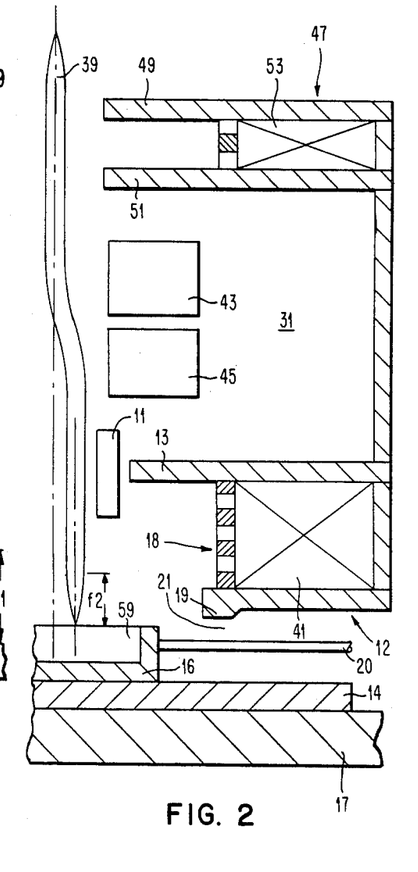
FIG. 2 is a schematic half-sectional drawing illustrating the operation of the variable axis immersion lens electron beam projection system of the present invention.

Referring now to FIG. 2, there is shown one embodiment of a variable axis immersion lens electron beam projection system according to the present invention. It is apparent that the variable axis immersion lens of the present invention eliminates lower magnetic compensation yoke 57, and the eddy currents produced thereby. It will be shown that the variable axis requirement (i.e., that the magnetic compensation field distribution is proportional to the first derivative of the axial projection lens field strength distribution) is still satisfied. It will also be shown that the magnetic compensation field produced by the remaining magnetic compensation yoke is approximately zero in the target area so that eddy currents are eliminated.

Referring again to FIG. 2, wherein like numbering is employed for those components which are the same as in FIG. 1, the variable axis immersion lens electron beam projection system of the present invention includes a variable axis immersion lens assembly 12, and a magnetic lens 47 having non-zero bore pole pieces 49 and 51, an excitation coil 53 for providing telecentric capability, and a pair of deflection yokes 43 and 45 predeflect the projected electron beam.

Immersion lens 12 includes an upper, non-zero bore pole piece 13 and a lower pole piece formed of a non-zero section 19 and a zero bore section 14 14. Excitation coil 41 activates immersion lens 12 and produces magnetic field lines which run from upper pole piece 13 to lower pole piece 14. A leg 18 of the immersion lens magnetic circuit includes alternating magnetic and non-magnetic sections so that the magnetic lines of force are not short-circuited. The magnetic circuit is also shaped at section 19 of the lower pole piece to permit flux to pass to zero bore section 14 with minimal reluctance and fringing. A single magnetic compensation yoke 11 provides a magnetic field which is proportional to the first derivative of the axial magnetic field produced by immersion lens 12.

FIG. 2 also illustrates the target holding, handling, and stepping means. Target 59 is mounted on a target holder 16 for providing accurate registration of the target within the electron beam projection system. A target handler arm 20 inserts the target into immersion lens 12 via opening 21 therein. A target stepper table 17 is employed for X-Y movement of the target. It will be recognized by those having skill in the art that many mechanical designs are possible for target holder 16, target handler 20 and target stepper 17. The details of such designs do not form a part of the present invention.

It will be noted, however, that since a lower compensation yoke is not required, the eddy currents which would be produced thereby in holder 16, handler 20 or stepper 17 are eliminated. Moreover, since the magnetic projection field produced by upper pole piece 13, lower pole piece section 14 and excitation coil 14 has zero slope in the vicinity of the target area, the compensation field produced by compensation yoke 11 has zero field strength in the vicinity of the target area. Accordingly, no eddy currents are generated by compensation yoke 11.

Other advantages also inhere from the variable axis immersion lens configuration of FIG. 2. First, since zero bore pole piece section 14 may be fabricated of a high permeability (e.g., several thousand or greater) ferromagnetic material, it provides shielding of the target area from any stray magnetic fields originating outside the immersion lens. Also, since the target is now placed within the variable axis immersion lens, the focal length of the immersion lens (designated in FIG. 2 as f2) is shorter than the focal length of the prior art variable axis lens (designated as f1 in FIG. 1), so that a reduction in axial chromatic and spherical aberrations and electron-electron interaction is also obtained.

Figure 4:
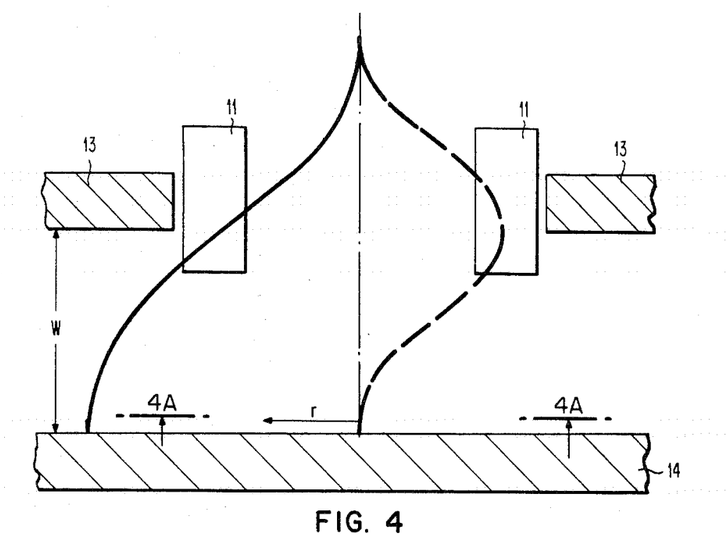
FIG. 4 is a schematic drawing partially broken away illustrating the configuration of the projection lens pole pieces and the magnetic compensation yoke of the present invention and a superimposed graphical depiction of the distribution of the magnetic field in the axial direction produced by the pole pieces and of the distribution of the magnetic field orthogonal to the axis produced by the magnetic compensation yoke.
Figure 4A:
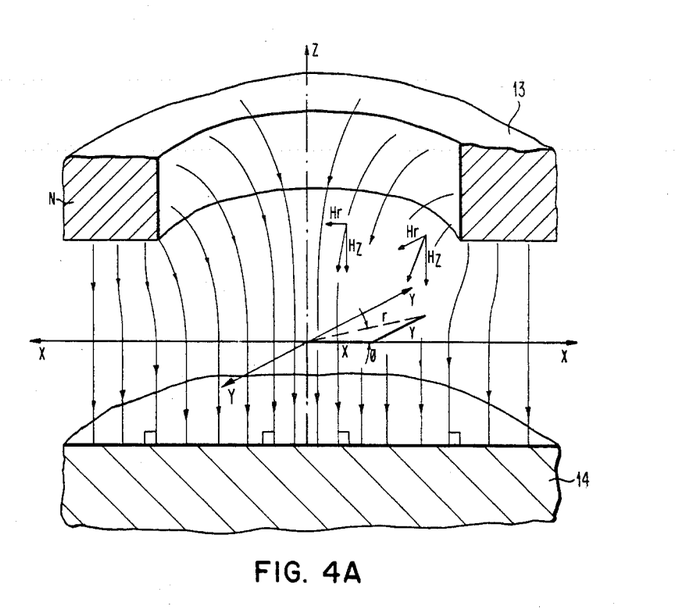
FIG. 4A is a depiction of the magnetic field produced by the projection lens of the present invention.

Referring now to FIGS. 4 and 4A, it will be shown that the variable axis immersion lens of the present invention satisfies the variable axis requirement and also eliminates eddy currents in the target area. FIG. 4 is a schematic diagram showing non-zero bore upper pole piece 13, the zero bore section of lower pole piece, 14 and the magnetic compensation yoke 11. As is well known, without excitation of magnetic compensation yoke 11, the magnetic field generated by pole pieces 13 and 14 produces magnetic field lines of rotational symmetry which define a geometrical electron optical axis. The geometrical electron optical axis is usually coincident with the center line extending through the center of the circular bore in upper pole piece 13. FIG. 4A depicts a typical distribution of the magnetic field on the symmetry axis. Examination of FIG. 4A shows that the magnetic field produced in the vicinity of lower pole piece section 14 is orthogonal thereto, and has zero slope for an appreciable distance away from lower pole piece section 14.

As the ratio of the width W (gap between pole pieces 13 and 14) and the diameter D of the circular bore in upper pole piece 13 is made small, i.e., less than about 1, the distribution of the magnetic field along the geometric electron optical axis is approximately Gaussian in shape as shown by the solid line curve of FIG. 4. It should be understood, however, that the electron beam projection system of the invention is not restricted to the use of pole piece configurations which result in Gaussian distributions.

When the magnetic compensation yoke 11 is activated, a magnetic field is generated which is orthogonal to the geometric electron optical axis. In accordance with the invention, magnetic compensation yoke 11 produces a magnetic field distribution which is proportional to the first derivative of the axial field strength distribution of the immersion lens 12 generated by pole pieces 13 and 14. The plot of the derivative of the field strength distribution of magnetic lens 12 is shown by the dashed line curve in FIG. 4. As shown, the first derivative is zero in the vicinity of the target area. Accordingly, the rapidly changing compensation yoke field produces no eddy currents in the vicinity of the target area.

In operation, the X and Y coils of the magnetic compensation yoke 11 receive currents proportional to X and Y currents which excite deflection yokes 43 and 45 and generate a magnetic field orthogonal to the geometric electron optical axis. The distribution along the symmetry axis of this field must be made proportional to the first derivative of the magnetic field on the geometric electron optical axis of the pole pieces. It has been found that this condition can be met by choosing the dimensions of the compensation yoke, namely the length and diameter of its coil accordingly, either by experiment or computation using computation methods known in the art. The magnitudes of the currents sent through the X and Y coils of the yoke have a value such that the magnetic deflection field produced is equal to the first derivative of the immersion lens field distribution on the symmetry axis multiplied by the deflection distance, r, from the axis. The currents $I_x$ and $I_y$ through the X and Y coils are related through the direction of deflection characterized by angle $\theta$ (see FIG. 4A) by the equation $\tan \theta = I_y/I_x$. The total field is proportional to $\sqrt{I_x^2 + I_y^2}$.

Figure 3:
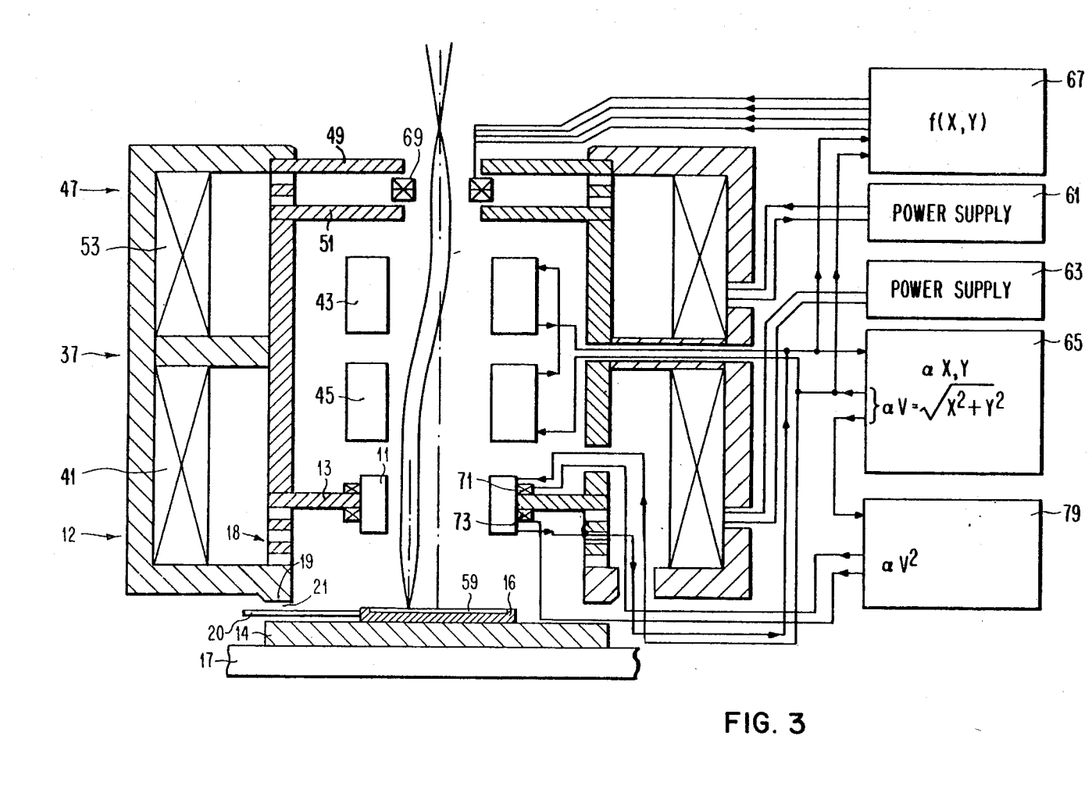
FIG. 3 is a more detailed schematic drawing illustrating the variable axis immersion lens electron beam projection system of the present invention.

Referring now to FIG. 3, a preferred embodiment of the variable axis immersion lens electron beam projection system of the present invention will be described. Astigmatism and field curvature are corrected using dynamic correction. As shown in FIG. 3, the block 61 is a power supply for excitation coil 53. Block 63 is a power supply for excitation coil 41. Block 65 represents a computer controlled driver for excitation of deflection yokes 43 and 45. Deflection yokes 43 and 45 have two sets of magnetic deflection coils which cooperate to deflect the electron beam in both an X and a Y direction in accordance with the usual practice. Deflection yokes 43 and 45 are typically comprised of a plurality of toroidal coils. Driver 65 also activates magnetic compensation yoke 11 which consists of a pair of X-Y magnetic deflection yokes. Magnetic compensation yoke 11 may comprise a simple saddle coil because of its smaller outer diameter for the same inner diameter as compared to a toroidal yoke of the same deflection sensitivity. The X-Y current sent to magnetic compensation yoke 11 is proportional to the X-Y currents sent to deflection yokes 43 and 45 and may be supplied by the same driver block 65.

In the first approximation, the field of the compensation yoke 11 compensates the radial component of the immersion lens 12 field along a line parallel to the symmetry axis of the lens having a distance proportional to the current into the compensation yoke. This line represents the shifted electron optical axis because the radial component of the field has become zero there.

Figure 6:
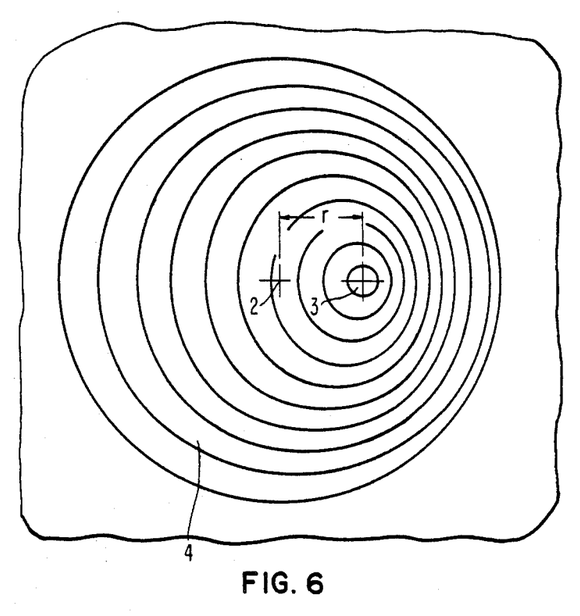
FIG. 6 is a cross-sectional view through the projection lens showing lines of equal magnetic potential generated by shifting the electron optical axis.

Referring to FIG. 6, it can be seen that the shift of the electron optical axis from the geometric electron optical axis 2 to position 3 results in a distortion of the rotational symmetry of the magnetic field lines 4 to a small extent. Without compensation, the slight distortion of the rotational symmetry would result in an astigmatic aberration. A dynamic correction coil assembly 69, preferably a dual quadrapole element, is provided to compensate for the astigmatic aberration. The block 67 represents a driver for the excitation of the dynamic astigmatism correction coil 69. This driver receives an input signal proportional to the currents which are sent to the X and Y deflection yokes 43 and 45 and generates a signal which is a function of the input in a known manner.

Figure 5:
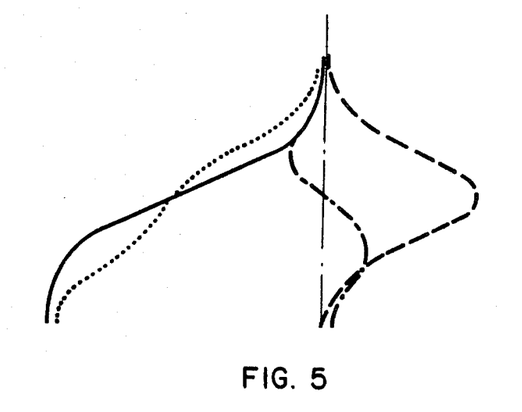
FIG. 5 is a graph depicting the distribution of the magnetic field strength of the projection lens, its first derivative, the compensated distribution of the axial components of the superimposed lens and the deflection fields of the compensation yoke along the shifted axis, and a distribution of the axial component of the dynamic focus correction coil on the geometrical symmetry axis.

In FIG. 5, the ideal axial field strength distribution of immersion lens 12 is shown by the solid line curve. The resulting field strength distribution along the new (shifted) electron optical axis is shown as a dotted curve in FIG. 5. The deviations from the solid (ideal) curve shown by the dotted curve are grossly exaggerated. This field is weaker than that on the optical axis and is preferably increased by the dynamic power correction coil. The deviation from ideal of the field strength distribution on the shifted axis is predominantly a second order function. It has been determined that this deviation can be corrected by providing additional dynamic correction coils which have a field strength proportional to the second derivative of the axial magnetic field strength distribution on the geometrical axis. The first derivative of the original field is shown by the dashed line curve in FIG. 5. The second derivative is shown by the dash-dot line curve of FIG. 5. As can be seen in FIG. 5, the second derivative has two extrema with alternating positive and negative values. The apparatus in FIG. 3 is provided with dynamic focus correction coils 71 and 73. Each of the dynamic focus correction coils provides a magnetic field whose distribution on the shifted axis is proportional to a portion of the second derivative of the field strength distribution of the lens on the shifted axis. The block 79 represents a driver for the excitation of the dynamic focus correction coils 71 and 73. This driver receives an input signal which is proportional to r, the deflection distance of the shifted axis, and generates a signal proportional to $r^2$.

The magnetic field of a pole piece lens to be used in an electron beam column was measured along its axis with a magnetic field probe. The magnetic field distribution obtained was differentiated. The general shape of the magnetic field of the pole piece lens and the first derivative of the curve was as generally shown in FIG. 4.

A saddle yoke for use as magnetic compensation yoke was then fabricated. The magnetic field distribution of the saddle yoke was calculated using well known mathematical expressions for calculation of magnetic field distributions as set forth in the literature, for example, E. Munro,: Design and Optimization of Magnetic Lenses and Deflection Systems for Electron Beams; J. Vac.-Science Technol. Vol. 12, No. 6 November/December 1975, pp. 1146-1150. Proposed physical dimensions of the saddle yoke were systematically varied by computer simulation and the magnetic field distribution was recalculated with each variation, until the calculated field distribution of a saddle yoke computer model approximately matched the first derivative of the magnetic field distribution of the pole piece lens. A saddle yoke was then fabricated in accordance with the calculated dimensions and the magnetic field of the fabricated saddle yoke was measured with a magnetic field probe when the saddle yoke was positioned inside the upper pole piece. An optimum position and orientation was determined by trial and error.

Figure 7:
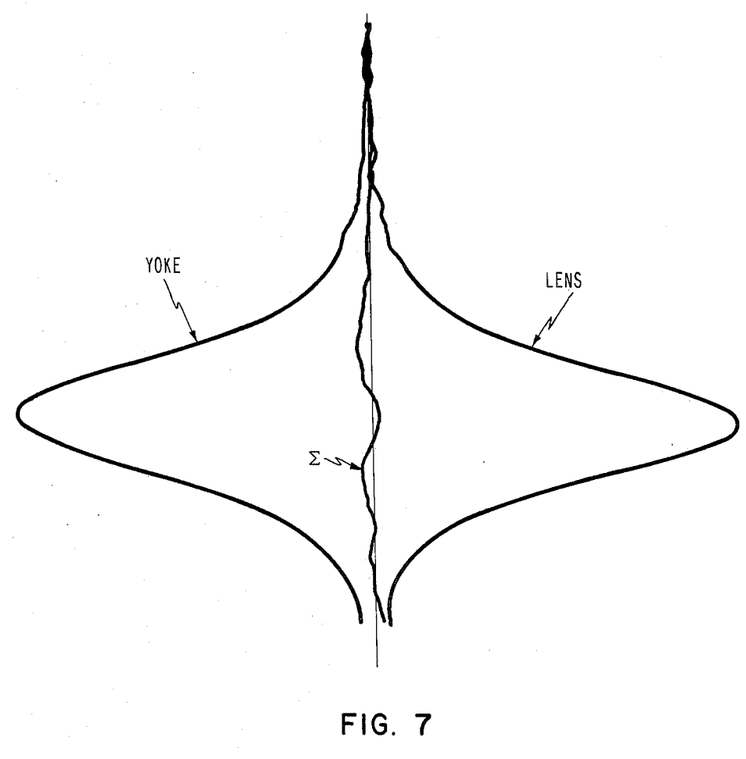
FIG. 7 is a graphical recorder trace of the measured magnetic field of the projection lens, its first derivative and the magnetic field of the compensation yoke.

FIG. 7 is a graphical representation of the results of actual measurements of the magnetic field of the pole piece lens. Also shown is the derivative of the axial magnetic field distribution and the actual magnetic field of the fabricated saddle yoke. By adjusting the current through the saddle yoke to a suitable value, both curves matched very closely so as to satisfy the condition of shifting of the electron optical axis of the lens. The difference of the two curves is also shown (as $\Sigma$) in FIG. 7. The difference should ideally amount to zero and the difference actually obtained, as shown, is small compared to the magnitude of the magnetic field.

Figure 7A:
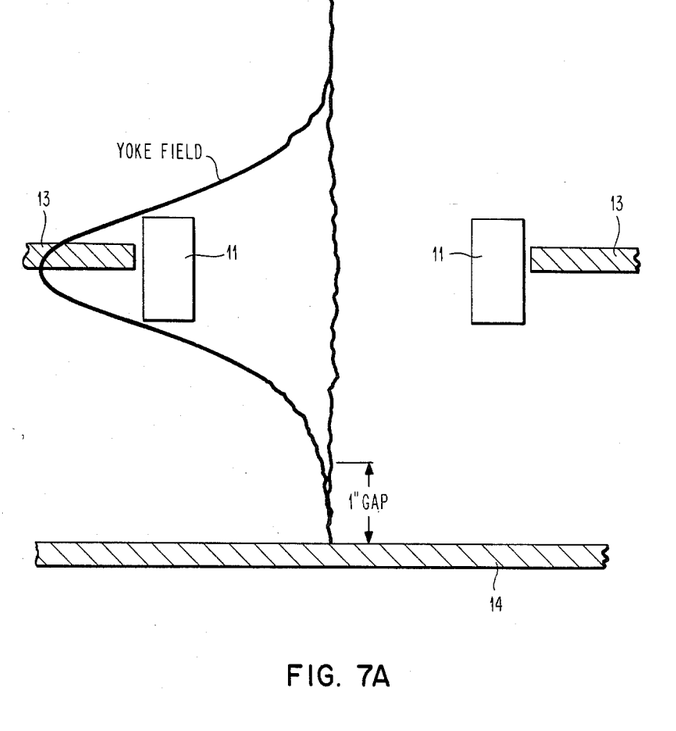
FIG. 7A is a graphical recorder trace of the measured magnetic field of the compensation yoke within the projection lens.

FIG. 7A shows the measured magnetic field of the compensation yoke within the projection lens. It can be seen that the field strength in the vicinity of the lower pole piece section 14 (i.e., within approximately one inch) is approximately zero. Accordingly, the dynamic effects of this field, and the consequent eddy currents produced thereby, are eliminated. The one inch gap provides ample room for target insertion into the immersion lens.

The variable axis immersion lens electron beam projection system was used in an electron beam column to image a square aperture onto a target plane. The current density distribution across the image in the target plane was measured by conventional scanning methods and displayed on an oscilloscope. An ideal current distribution would approximate a square wave. In practice, however, aberrations are always present which result in an edge slope of finite magnitude. Defocusing of the electron beam by a change in the electron acceleration voltage also causes a reduction in edge slope. The position of the image in the target plane can also be monitored by the scanning method.

Figure 8:
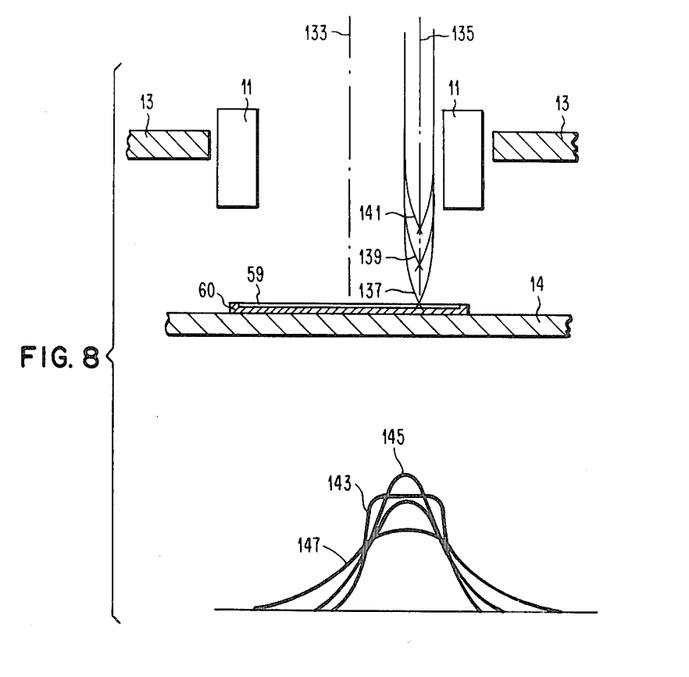
FIG. 8 is a schematic cross-sectional view of the variable axis immersion lens and compensation yoke of the present invention showing the path of an electron beam through the lens at various electron beam energies.

In the variable axis immersion lens with pole pieces 13 and 14, 19 and compensation yoke 11 according to the present invention, the electron optical axis is shifted from axis of symmetry 133 to the center of the entering electron beam 135, as shown in FIG. 8. For focused electrons of nominal velocity, corresponding to an acceleration voltage of 25,000 volts, the electron beam is focused in the target plane at the position where the shifted axis intersects the target plane, as shown at position 137. The current density distribution as shown on the oscilloscope is schematically shown as the curve 143. Since aberrations, such as spherical aberration and coma, are much smaller on and close to the electron optical axis, the edge slope of curve 143 is steep. The focus point 139 indicates the focus for slower electrons and the focus point 141 indicates the focus for even slower electrons. The defocused images, however, are not moved away from the electron optical axis but remain at the intersection of the shifted electron optical axis and the target plane. The current density distribution traces for the three cases are schematically shown by the curves 143, 145 and 147, respectively.

Changes in electron beam energy still cause defocusing as a result of axial chromatic aberration. Elimination of lateral movement however, shows complete compensation for movement of the transverse radial chromatic aberration typically associated with off-axis beam positions. This demonstrates that the beam is still on-axis. The variable axis of the lens remains in coincidence with the deflected electron beam.

Figure 9:
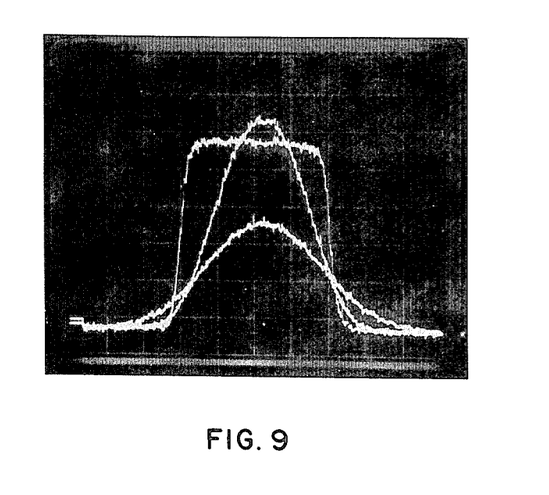
FIG. 9 is a photograph of an oscilloscope trace of the spot shapes of deflected electron beams of different energies which have been focused by the variable axis immersion lens of the present invention.

FIG. 9 shows an actual oscilloscope trace of the current density distribution in the target plane obtained using the variable axis immersion lens electron beam projection system of the invention. By application of suitable current to the compensation yoke, the electron optical axis was shifted into the center of the entering electron beam which was displaced 7 mm from the geometrical axis of symmetry (5 mm in both X and Y directions). The acceleration voltage of the beam was then changed from 25,000 volts (optimum focus and steepest edge slopes) by −100 volts and by −200 volts. This resulted in traces of defocused images. The defocused images are, however, not axially displaced from the trace of the focused image for electrons having an acceleration voltage corresponding to 25,000 volts. This experimental result obtained with a particular embodiment of the invention demonstrates that the electron optical axis has actually been shifted.

While the invention has been particularly shown and described with reference to a preferred embodiment thereof, it will be understood by those skilled in the art that various changes in form and details may be made without departing from the spirit and scope of the invention.

We claim:

1. A variable axis immersion lens for an electron beam projection system comprising:
   magnetic immersion lens means for producing a magnetic field to focus an electron beam, said magnetic immersion lens means including an upper pole piece having a predetermined bore, a lower pole piece having a non-zero bore section and a zero bore section, and means for inserting a target between said upper pole piece and said zero bore section of said lower pole piece; and
   magnetic compensation means for producing a magnetic compensation field between said magnetic immersion lens means upper and lower pole pieces, said magnetic compensation field being proportional to the first derivative of the axial magnetic projection field to thereby cause the electron optical axis of said magnetic immersion lens means to shift to the position of the deflected electron beam, and being approximately zero in the vicinity of said lower pole piece to thereby eliminate stray magnetic fields in the vicinity of said lower pole piece zero bore section.

2. The variable axis immersion lens of claim 1 wherein said magnetic compensation means is positioned within the bore of said upper pole piece of said magnetic immersion lens means.

3. The variable axis immersion lens of claim 2 wherein said magnetic compensation means is a magnetic compensation yoke, positioned within the bore of said upper pole piece.

4. The variable axis immersion lens of claim 1 wherein said lower pole piece zero bore section of said magnetic immersion lens means is a solid plate of high permeability, nonconductive, ferromagnetic material.

5. The variable axis immersion lens of claim 1 wherein said predetermined bore of said magnetic immersion lens means upper pole piece and the distance between said upper pole piece and lower pole piece zero bore section are arranged so that said axial magnetic projection field has a zero first derivative in the vicinity of said lower pole piece zero bore section.

6. The variable axis immersion lens of claim 1 wherein said magnetic immersion lens means includes dynamic correction coil means for compensating astigmatism distortions due to the shift of the electron optical axis.

7. The variable axis immersion lens of claim 1 wherein said magnetic immersion lens means includes dynamic focus correcting coil means for compensating errors proportional to the second derivative of said axial magnetic projection field.

8. The variable axis immersion lens of claim 1, further including a telecentric magnetic lens for forming a parallel electron beam bundle prior to focusing the electron beam.

9. An electron beam projection system comprising:

electron beam producing means for producing an electron beam;

deflection means for deflecting said electron beam;

magnetic immersion lens means for producing a magnetic field to focus the deflected electron beam, said magnetic immersion lens means including an upper pole piece having a predetermined bore, a lower pole piece having a non-zero bore section and a zero bore section, and means for inserting a target between said upper pole piece and said lower pole piece zero bore section; and magnetic compensation means for producing a magnetic compensation field between said magnetic immersion lens means upper and lower pole pieces, said magnetic compensation field being proportional to the first derivative of the axial magnetic projection field to thereby cause the electron optical axis of said magnetic immersion lens means to shift to the position of the deflected electron beam, and being approximately zero in the vicinity of said lower pole piece to thereby eliminate stray magnetic fields in the vicinity of said lower pole piece zero bore section.

10. The electron beam projection system of claim 9 wherein said magnetic compensation means is positioned within the bore of said upper pole piece of said magnetic immersion lens means.

11. The electron beam projection system of claim 10 wherein said magnetic compensation means is a magnetic compensation yoke, positioned within the bore of said upper pole piece.

12. The electron beam projection system of claim 9 wherein said magnetic immersion lens means lower pole piece zero bore section is a solid plate of high permeability, nonconductive, ferromagnetic material.

13. The electron beam projection system of claim 9 wherein said predetermined bore of said magnetic immersion lens upper pole piece and the distance between said upper pole piece and said lower pole piece zero bore section are arranged so that said axial magnetic projection field has a zero first derivative in the vicinity of said lower pole piece.

14. The electron beam projection system of claim 9 further including dynamic correction coil means for compensating astigmatism distortions due to the shift of the electron optical axis.

15. The electron beam projection system of claim 9 further including dynamic focus correcting coil means for compensating errors proportional to the second derivative of the axial magnetic projection field.

16. The electron beam projection system of claim 9 further including a telecentric magnetic lens for forming a parallel electron beam bundle prior to focusing the electron beam.

17. An electron beam projection system comprising:
electron beam producing means for producing an electron beam;

deflection means for deflecting said electron beam; and, a variable axis immersion lens, having upper and lower pole pieces and means for inserting a target therebetween, for producing an axial magnetic projection field having zero first derivative in the vicinity of said lower pole piece, and for producing a magnetic compensation field which is proportional to the first derivative of said axial magnetic projection field, to thereby focus the deflected electron beam and shift the electron optical axis to coincide with the deflected electron beam and eliminate stray magnetic fields in the vicinity of said lower pole piece.

* * * * *